United States Patent
Sakamoto

[19]

[11] Patent Number: 5,931,441
[45] Date of Patent: Aug. 3, 1999

[54] METHOD OF ISOLATING VIBRATION IN EXPOSURE APPARATUS

[75] Inventor: Hideaki Sakamoto, Tokyo, Japan

[73] Assignee: Nikon Corporation, Tokyo, Japan

[21] Appl. No.: 08/807,902

[22] Filed: Feb. 27, 1997

[30] Foreign Application Priority Data

Feb. 29, 1996 [JP] Japan ................................. 8-042696
Feb. 29, 1996 [JP] Japan ................................. 8-042697

[51] Int. Cl.$^6$ ................................................ F16M 13/00
[52] U.S. Cl. ............................ 248/550; 248/638; 702/56
[58] Field of Search ..................... 73/662–668; 248/550, 248/562, 636, 638; 364/508; 180/902; 267/136, 140.11, 140.14, 140.15; 702/56

[56] References Cited

U.S. PATENT DOCUMENTS

| | | | |
|---|---|---|---|
| 4,083,433 | 4/1978 | Geohegan, Jr. et al. ................ | 188/1 B |
| 4,916,632 | 4/1990 | Doi et al. ................................. | 364/508 |
| 4,929,874 | 5/1990 | Mizuno et al. .......................... | 73/668 |
| 5,433,422 | 7/1995 | Ross et al. .......................... | 267/140.15 |
| 5,478,043 | 12/1995 | Wakui ..................................... | 248/550 |
| 5,613,009 | 3/1997 | Miyazaki et al. ......................... | 381/71 |

FOREIGN PATENT DOCUMENTS 8-166043   6/1996   Japan .

*Primary Examiner*—Hezron Williams
*Assistant Examiner*—Rose M. Miller
*Attorney, Agent, or Firm*—Morgan, Lewis & Bockius LLP

[57] ABSTRACT

A method is provided for suppressing vibration of a body supported by an anti-vibration mount having a predetermined damping coefficient and a predetermined spring constant. The method includes the steps of applying a predetermined force to the body, detecting motion of the body generated in response to the predetermined force, and deriving a mechanical constant of the body from the damping coefficient and the spring constant of the anti-vibration mount and the detected motion of the body generated in response to the predetermined force. The method further includes the steps of monitoring the vibration of the body, and exerting a controlling force to the body in accordance with the monitored vibration of the body and the derived mechanical constant of the body to suppress the vibration of the body.

28 Claims, 8 Drawing Sheets

METHOD OF ISOLATING VIBRATION IN EXPOSURE APPARATUS

BACKGROUND OF THE INVENTION

1. Field of the Invention

The present invention relates to a vibration isolator for isolating vibration in an apparatus, and more particularly, to a vibration isolator for isolating vibration and a method of isolating vibration in an exposure apparatus used in photolithography processes for manufacturing semiconductor devices or the like.

2. Discussion of the Related Art

The manufacture of semiconductor devices (or liquid crystal display devices, imaging devices such as CCDs, thin film magnetic heads, or the like) employs photolithography in order to expose a pattern on a reticle (or photomask or the like) onto a wafer (or a glass plate or the like). In the photolithography process, projection exposure apparatus such as a stepper, proximity-type exposure apparatus, and the like have been used. In these exposure apparatus, an extremely high degree of vibration isolation is required in order to transfer the pattern of the reticle onto the wafer with high alignment precision. To this end, the main body of such an exposure apparatus (the portion that transfers the pattern of the reticle onto the wafer) is placed on a vibration isolator which suppresses vibration having external and internal origins.

A vibration isolator is usually composed of spring-like materials and vibration damping materials. In the conventional vibration isolators, the performance in vibration isolation does not depend on the vibration status or the position (posture or the like) of the apparatus. Such vibration isolators are generally called "passive vibration isolators". In related work, "active vibration isolators" have recently come into use. The active vibration isolator detects the external and internal vibration in real time using sensors, such as an accelerometer (acceleration sensor), displacement sensor, or the like, and changes its performance according to the detected results.

The following two functions are primarily required of vibration isolators used in exposure apparatus. The first function is to block the transmission of vibration originating from the floor, where the exposure apparatus is placed, to the main body of the exposure apparatus. The second is to attenuate the vibration of the body of the exposure apparatus generated by internal motions of the apparatus, such as wafer and reticle stage motions or the like. In passive vibration isolators, these two functions have an inverse relationship with each other—when one of the functions is strengthened, the other is weakened. In contrast, active vibration isolators are capable of satisfying the two functions above and hence have garnered much attention recently.

An active vibration isolator in general uses an air spring (air damper) as a support mount (vibration damping mount) for supporting the weight of the apparatus main body which is an object of vibration isolation. The air spring is a soft spring having small rigidity, and thus, blocks the transfer of the middle and high frequency components of vibration (20 Hz and up) out of the entire vibration components coming from the floor. The active vibration isolator also employs vibration detection sensors and actuators to suppress the low-frequency-range components of the vibration using feedback control.

In more detail, when applied to an exposure apparatus, the active vibration isolator of this type is usually composed of 1) support mounts for supporting the weight of the exposure apparatus body; 2) position sensors for detecting the posture and position of the exposure apparatus body; 3) vibration sensors (velocity or acceleration sensor) for detecting the motion status (vibration) of the exposure apparatus body; 4) actuators for generating forces to suppress the vibration of the exposure apparatus body; and 5) a control unit for calculating thrusts to be generated by the actuators according to the results detected by the sensors. In order to stabilize and support the exposure apparatus body and to measure and control the vibration of the exposure apparatus body for all degrees of freedom (six degrees of freedom), the conventional active vibration isolator needs to employ at least three or more support mounts, six or more position sensors or vibration sensors, and six or more actuators.

In related work, packaged active vibration isolators have been announced. These packaged active vibration isolators can be applied directly to exposure apparatus without modifying the exposure apparatus. However, it is more efficient from space considerations to use vibration isolator that is made into one unit with the exposure apparatus body.

As noted above, in such an active vibration isolator that is incorporated into the exposure apparatus body, it is necessary to install a large number of constituent elements in order to efficiently suppress vibration for all six degrees of freedom (three degrees of freedom for the translational direction and three degrees of freedom for the rotational direction). In particular, when detecting rotational vibration which has three degrees of freedom, the vibration component for each degree of freedom is obtained by using two detection sensors measuring the translational vibrations at their respective positions remote to each other, and by extracting the difference between the measured values of the two detection sensors. To obtain high precision in such measurement, the spacing between the two detection sensors must be as large as possible. This spacing requirement between the detection sensors creates a problem.

In addition, in the case of precision vibration isolators, such as those used in exposure apparatus, forces (reaction forces) are exerted in the vertical direction to the exposure apparatus body by three or more support mounts and by a plurality of actuators (also referred to as "Z actuators") which generate thrusts in the vertical direction. Conventionally, the support mounts and Z actuators are positioned in parallel between the installation floor and the mounting plate of the exposure apparatus body. As a result, the reaction forces of these support mounts and Z actuators may elastically deform the mounting plate of the exposure apparatus receiving these forces. This prevents the precise positioning of the wafer and reticle stages, for example. To solve this problem, the following vibration isolators have been proposed.

(A) Elastic deformation is reduced by strengthening, to the extent possible, the rigidity of the mounting plate which receives forces from the Z actuators and support mounts.

(B) The Z actuators are installed inside the exposure apparatus body (target object for which vibration are to be reduced) instead of between the floor surface and the exposure apparatus body. Vibration of the apparatus are suppressed using inertial forces generated by such Z actuators.

(C) The support mounts themselves generate thrusts in the Z direction. Z actuators are not provided in particular.

However, in the system (C), a new technology is needed in order to solve the problems of heat generation and poor durability of the support mounts. In the system (A), it is impossible to cope with precision exposure apparatus where even minute deformations of the mounting plate are not permissible. There is also a concern that the mounting plate will become excessively large in this case. In the system (B), there arises a problem that the vibration reduction efficiency is small and the production cost would become very high in order to achieve sufficient vibration reduction effect.

Recent exposure apparatus requires much higher accuracy in positioning of the wafer and reticle stages or the like than the conventional exposure apparatus. Also, because the structure of the exposure apparatus is becoming more complicated, the residual vibration amount allowed in an active type vibration isolator is becoming smaller—from the micron order to the sub-micron order. In order to perform such high precision control, it becomes necessary for the control unit described in (5) above to obtain the mechanical constants, such as the weight, center of gravity, moment of inertia, and the principal axis of inertia, with considerable accuracy.

However, in the case of projection exposure apparatus such as a stepper, it has been thought to be nearly impossible to obtain sufficiently accurate mechanical constants using a simple method. One method that has been used is to calculate the mechanical constants with reference to the design drawings. The accuracy of the mechanical constants estimated in such a way can be improved by measuring mechanical constants or the like of each part of the apparatus. However, the accuracy is still not sufficient, and a problem occurs when such calculated constants are used in the control unit as mechanical constants of the entire apparatus, because the vibration of the apparatus cannot be controlled with a high degree of accuracy.

SUMMARY OF THE INVENTION

Accordingly, the present invention is directed to a vibration isolator and a method of isolating vibration that substantially obviates the problems due to limitations and disadvantages of the related art.

An object of the present invention is a vibration isolator for isolating vibration of an apparatus, which occupies less space for installing detection sensors detecting the vibration of the apparatus.

Another object of the present invention is a vibration isolator for isolating vibration in an apparatus, which can reduce elastic deformation of the apparatus and effectively suppress the vibration at low cost.

Another object of the present invention is a method of isolating vibration in an apparatus through controlling the vibration with a high degree of accuracy.

A further object of the present invention is a vibration isolator that can control vibration in an apparatus with a high degree of accuracy.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a vibration detector for detecting vibration of a body having at least six degrees of freedom, the vibration detector including a first sensor outputting first signals indicating the vibration of a first reference point of the body in a plurality of first directions; a second sensor outputting second signals indicating the vibration of a second reference point of the body in a plurality of second directions; a third sensor outputting third signals indicating the vibration of a third reference point of the body in at least one third direction, wherein the first, second, third reference points define a plane, and the plurality of first directions, the plurality of second directions, and the at least one third direction are chosen to enable the detection of the vibration of the body in the at least six degrees of freedom; and a calculation unit coupled to the first sensor, the second sensor, and the third sensor to receive the first signals, the second signals, and the third signals to detect the vibration, the calculation unit deriving the vibration of the body in the at least six degrees of freedom from the first signals, the second signals, and the third signals.

In another aspect, the present invention provides a vibration isolation mount for supporting an apparatus with respect to an installation surface and for controlling vibration of the apparatus, the vibration isolation mount including a support mount having a first end connected to the installation surface and a second end fixed to the apparatus to support the apparatus with respect to the installation surface, wherein the support mount receives a force from the apparatus along a first line of action; and an actuator adjacent the support mount, the actuator having a first end connected to the installation surface and a second end in contact with the apparatus, the actuator being movable to exert a controlling force for controlling the vibration to the apparatus along a second line of action coincident with the first line of action.

In another aspect, the present invention provides a vibration isolator for supporting an apparatus with respect to an installation surface and for suppressing vibration of the apparatus having at least six degrees of freedom, the vibration isolator including at least three vibration isolation mounts, each of the vibration isolation mounts including a support mount having a first end connected to the installation surface and a second end fixed to the mounting plate to support the apparatus with respect to the installation surface, wherein the support mount receives a force from the apparatus along a first line of action; and an actuator adjacent the support mount, the actuator having a first end connected to the installation surface and a second end in contact with the apparatus, the actuator being movable to exert a controlling force for suppressing the vibration to the apparatus along a second line of action coincident with the first line of action; a plurality of sensors outputting vibration signals indicating the vibration of the apparatus; and a controller coupled to the plurality of sensors to receive the vibration signals to derive the vibration of the apparatus in the at least six degrees of freedom, the controller communicating with the actuators to control the controlling forces of the actuators in accordance with the vibration signals.

In another aspect, the present invention provides a method for suppressing vibration of a body supported by an anti-vibration mount having a predetermined damping coefficient and a predetermined spring constant, the method including the steps of applying a predetermined force to the body, detecting motion of the body generated in response to the predetermined force; deriving a mechanical constant of the body from the detected motion of the body generated in response to the predetermined force; monitoring the vibration of the body; and exerting a controlling force to the body in accordance with the monitored vibration of the body and the derived mechanical constant of the body to suppress the vibration of the body.

In another aspect, the present invention provides a vibration isolator for suppressing vibration of a body installed over an installation surface, the vibration isolator including a plurality of anti-vibration mounts, each of the anti-vibration mounts having a first end disposed on the installation surface and a second end in contact with the body to support the body over the installation surface, wherein the anti-vibration mounts each have predetermined spring constants and predetermined damping coefficients; a plurality of first actuators applying predetermined forces to the body; a plurality of first sensors detecting a motion of the body generated in response to the predetermined forces; a calculation unit communicating with the first actuators and first sensors, the calculation unit deriving mechanical constants of the body from the detected motion of the is body generated in response to the predetermined force; a plurality of second sensors monitoring the vibration of the body; and a plurality of second actuators exerting a controlling force to the body in accordance with the monitored vibration of the body and the derived mechanical constant of the body to suppress the vibration.

In another aspect, the present invention provides a vibration isolator for isolating vibration in an object of vibration isolation, the vibration isolator including a plurality of vibration damping mounts for supporting the object of vibration isolation; a plurality of actuators controlling the vibration in the object of vibration isolation; three detection sensors for detecting displacements at three different points on the object of vibration isolation; and a controller for controlling the plurality of actuators based on outputs of the three detection sensors, wherein a posture or moving status of the object of vibration isolation having six degrees of freedom is detected by the three detection sensors.

In another aspect, the present invention provides a vibration isolator for isolating vibration in an object of vibration isolation, the vibration isolator including a plurality of vibration damping mounts for supporting the object of vibration isolation, a predetermined vibration damping mount out of the plurality of vibration damping mounts having a spring member supporting the object of vibration isolation along a predetermined line of action; and a plurality of actuators for controlling vibration in the object of vibration isolation, one of the plurality of actuators having a thrust center line, wherein the one of the plurality of actuators is adapted such that the thrust center line of the actuator coincides with the predetermined line of action of the spring member.

In another aspect, the present invention provides a method for controlling a vibration isolator having a plurality of vibration damping mounts supporting an object of vibration isolation over an installation surface, a detection sensor detecting a posture and a moving status of the object of vibration isolation, and an actuator controlling vibration in the object of vibration isolation based on an output of the detection sensor, the method including the steps of acquiring a response output of the detection sensor in response to vibration of the object of vibration isolation generated by driving the actuator by a predetermined driving amount; and determining a mechanical constant of the object of vibration isolation based on a relation between the response output of the detection sensor and the predetermined driving amount of the actuator.

In a further aspect, the present invention provides a vibration isolator for isolating vibration in an object of vibration isolation, the vibration isolator including a plurality of vibration damping mounts over an installation surface for supporting the object of vibration isolation; a detection sensor detecting a posture and moving status of the object of vibration isolation; an actuator controlling the vibration in the object of vibration isolation based on an output of the detection sensor; a first controller for controlling a driving amount of the actuator based on the output of the detection sensor and a predetermined parameter; a second controller for controlling the driving amount of the actuator independent of the output of the detection sensor; and a computation unit for determining a mechanical constant of the object of vibration isolation based on an response output of the detection sensor when the actuator is driven through the second controller by a predetermined amount, the computation unit determining the predetermined parameter for controlling the driving amount of the actuator from the output of the detection sensor based on the mechanical constant.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a farther understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

First Preferred Embodiment

Hereafter, a configuration of the vibration isolator according to a first preferred embodiment of the present invention will be described with reference to FIGS. 1, 2, and 4. This embodiment has application to a stepper-type projection exposure apparatus.

Figure 1:
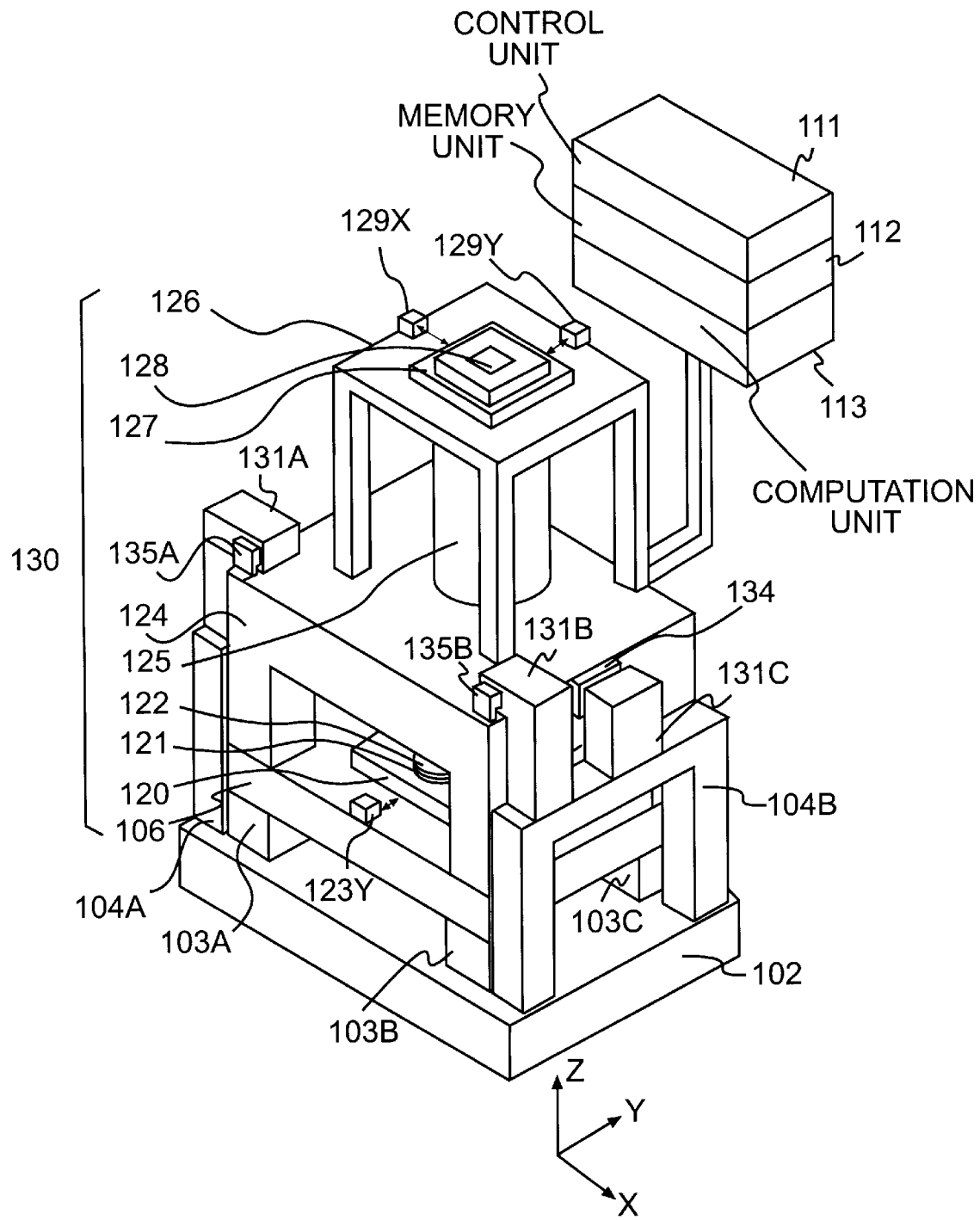
FIG. 1 is a perspective view showing the overall structure of a projection exposure apparatus to which preferred embodiments of the present invention are applied.
Figure 2:
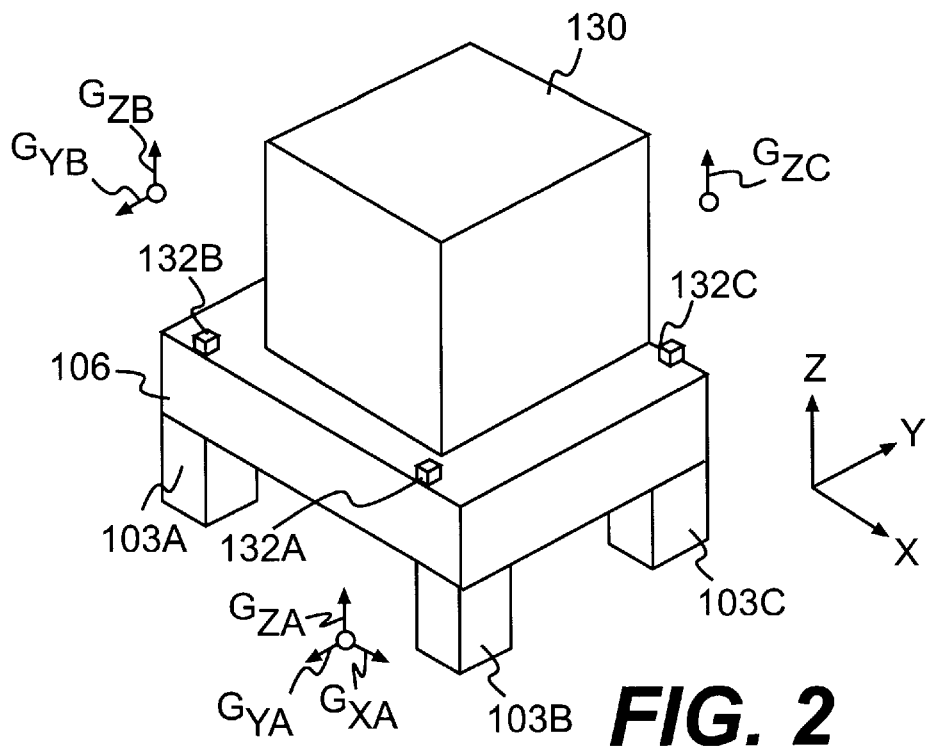
FIG. 2 is a perspective view showing the measurement directions and arrangement of acceleration sensors according to a first preferred embodiment of the present invention.

FIG. 1 shows a perspective view showing the overall structure of the projection exposure apparatus of the present embodiment. In FIG. 1, four vibration isolation mounts (only three vibration isolation mounts 103A to 103C appear in FIG. 1) are installed on a base frame 102 anchored on a floor. A mounting plate 106 of the projection exposure apparatus is installed via these vibration isolation mounts 103A to 103C. The vibration isolation mounts 103A to 103C are positioned near the corners of the rectangular bottom surface of the mounting plate 106, and the bottom of each vibration isolation mount is fixed to the base frame 102 while the tops thereof is fixed to the mounting plate 106. These vibration isolation mounts 103A to 103C are controlled by a control unit 111 which also controls the action of the whole apparatus. A detailed description of the structure of the vibration isolation mounts 103A to 103C will be given later. Because a projection optical system 125 is used in the present embodiment, as will be described below, it is convenient to take the Z axis parallel to the optical axis of the projection optical system 125 and the X and Y axes in a plane perpendicular to the Z axis, as shown in FIG. 1.

A wafer stage 120 is installed on the mounting plate 106. A wafer 122 is held by a wafer holder 121 located on the wafer stage 120 by a vacuum chuck or the like. A first column 124 having four legs surrounds the wafer stage 120 on the mounting plate 106. The projection optical system 125 is installed at the center of the top plate of the first column 124. Furthermore, a second column 126 having four legs is installed on the top plate of the first column 124 to surround the projection optical system 125. A reticle 128 is mounted at the center of the top plate of the second column 126 via a reticle stage 127. A laser interferometer 123Y, which measures the position of the wafer stage 120 along the Y direction, is installed near the edge of the top surface of the mounting plate 106 on the −Y direction side. Similarly, an X direction laser interferometer (not shown in the figure), which measures the position of the wafer stage 120 in the X direction, is also installed. The wafer stage 120 performs the positioning of the wafer 122 two dimensionally according to the measurement results obtained at the laser interferometer 123Y and the X direction laser interferometer. The wafer stage 120 also has functions of moving, rotating, and leveling the wafer 122 with respect to the Z direction.

In addition, near the edges of the top plate of the second column 126 on the −X direction and +Y direction sides, laser interferometers 129X and 129Y are installed to measure the position of the reticle stage 127 along the X and Y directions, respectively. The reticle stage 127 adjusts the rotation of the reticle 128, and conducts fine position adjustment of the reticle 128 in two dimensions in accordance with the measured values at the laser interferometers 129X and 129Y. An illumination optical system (not shown in the figure) is placed above the reticle 128. The image of the pattern on the reticle 128 is successively transferred onto each shot area of the wafer 122 through the projection optical system 125 by exposing radiation (exposing light or the like) originating from the illumination optical system. An exposure apparatus body 130 is defined by the reticle stage 127, wafer stage 120, and the first and second columns 124, 126 which support the stages. The mounting plate 106 is normally included in the exposure apparatus body 130. However, for the sake of convenience in the following description, the exposure apparatus body 130 is mounted on the mounting plate 106 and is regarded as a separate entity from the mounting plate 106.

Block U-shaped support pillars 104A and 104B that can be considered rigid bodies are provided near the edges of the base frame 102 on the −X direction and +X direction sides. Near the edge of the top of the support pillar 104A on the −Y direction side, a voice coil motor type actuator 131A is installed. The actuator 131A is composed of a stationary element and a movable element 135A. The stationary element has a coil installed therein. The movable element 135A is made of a magnetic material and anchored to the top plate of the first column 124. By controlling the current flowing in the coil in the stationary element of the actuator 131A, it is possible to apply a force to the movable element 135A in the ±Y directions. Similarly, near the edge of the top plate of the support pillar 104B on the −Y direction side, an actuator 131B similar to the actuator 131 A is installed. The actuator 131B generates a force in the ±Y directions to a movable element 135B anchored to the top plate of the first column 124. Also, near the center of the top plate of the support pillar 104B, an actuator 131C is provided to generate a force in the ±X directions to a movable element 134. The movable element 134 is composed of a magnetic material and fixed to the side surface of the first column 124 facing the actuator 131 C. These actuators 131 A to 131C are controlled by the control unit 111. In particular, the forces applied by the actuators 131A to 131C to the corresponding movable elements 135A, 135B and 134 are controlled by the control unit 111. In this embodiment, the displacement of the exposure apparatus body 130 in the Y direction and the rotational angle around the Z axis are controlled by the actuators 131A and 131B, and the displacement in the X direction is controlled by the actuator 131C. In addition, the displacement of the exposure apparatus body 130 in the Z direction, the rotational angle about the X axis, and the rotational angle about the Y axis are controlled by the four vibration isolation mounts 103A to 103C (and the one not shown).

In this embodiment, three acceleration sensors are installed on the mounting plate 106 to detect the acceleration (vibration) of the exposure apparatus body 130. FIG. 2 is a simplified perspective view showing the positions of the acceleration sensors on the mounting plate 106. In FIG. 2, three acceleration sensors 132A to 132C for detecting the acceleration (vibration) of the mounting plate 106 (this can be regarded as the acceleration or vibration of the exposure apparatus body 130) are provided on the mounting plate 106 near the exposure apparatus body 130. The three acceleration sensors 132A to 132C are positioned near the three corners of the top surface of the mounting plate 106: at the +X, −Y direction corner, the −X, −Y direction corner, and the +X, +Y direction corner, respectively. As indicated by the arrows in FIG. 2, the acceleration sensor 132A detects the acceleration at the position of the sensor in the X, Y, and Z directions. The acceleration sensor 132B detects the acceleration at its location in the Y and Z directions, and the acceleration sensor 132C detects the acceleration at its location in the Z direction. The detected values from the detection sensors 132A to 132C are supplied to a computation unit 113 in FIG. 1.

Parameters (gains or the like) are used in calculating the thrust of each actuator, and are stored in a memory unit 112 attached to the control unit 111 in FIG. 1. Using these parameters and the information of vibration detected by the acceleration sensors 132A to 132C, the computation unit 113 calculates the thrust of each actuator necessary to suppress the vibration of the exposure apparatus body 130. The results are provided to the control unit 111. The control unit 111 controls the actuators so as to eliminate the vibration of the exposure apparatus body 130 according to the results supplied from the computation unit 113. As the acceleration sensors 132A to 132C, it is possible to use servo-type sensors, piezoelectric-type acceleration sensors, or the like. In addition, it is also possible to use other types of detection sensors in place of the acceleration sensors 132A to 132C. For example, eddy current-type, static capacity-type, and laser reflection-type displacement sensors (position sensors) may be used. However, it is preferable to use the same type of detection sensor, i.e., the three detection sensors being all displacement sensors or acceleration sensors.

Next, the structure of the vibration isolation mount 103A is described. FIG. 4 is a perspective view showing the structure of the vibration isolation mount 103A. As shown in FIG. 4, the vibration isolation mount 103A of the present embodiment includes a support mount 107 that supports the mounting plate 106 and an actuator 108 that generates a thrust to the mounting plate 106. In this embodiment, the support mount 107 and the actuator 108 are arranged effectively in parallel, but in such a way that the directions of acting forces (the Z direction in this case) coincide. The actuator 108 is a voice coil motor type actuator composed of a stationary element 110 and a movable element 109. The stationary element 110 has a rectangular coil installed therein, and the movable element 109 is made from magnetic material. The thrust of the actuator is regulated by changing the current flowing in the rectangular coil built in the stationary element 110.

Figure 4:
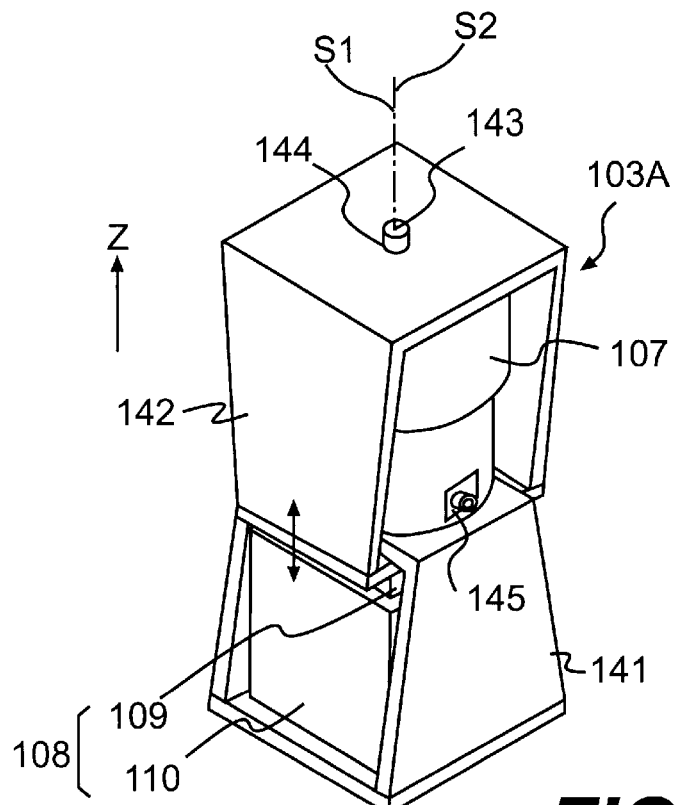
FIG. 4 is a perspective view showing the structure of the vibration isolator according to the first preferred embodiment of the present invention.

As shown in FIG. 4, the cylindrical shaped, support mount 107 is anchored on the substantially square, top plate of a case-shaped lower frame 141. The top of the lower frame 141 is slightly narrower than its lower part, and there are two openings at two opposing sides of the lower frame 141. The support mount 107 is composed of an air damper using air as the spring material, and the air pressure of the support mount 107 is regulated by an air valve 145 provided in the bottom side surface of the support mount 107.

The stationary element 110 of the actuator 108 is fixed on the bottom plate of the lower frame 141 anchored on the base frame 102 in FIG. 1. The body of movable element 109 is inserted into the stationary element 110 so as to be slidable along the inner walls of the stationary element 110, and the top of the movable element 109 is fixed to the bottom plate of a case-shaped upper frame 142. The upper frame 142 is slightly narrowed near the bottom end, and has openings at two opposing sides along the direction perpendicular to the open sides of the lower frame 141. The bottom plate of the upper frame 142 is inserted into the lower frame 141, and is vertically movable inside the frame 141 in response to a thrust generated by the actuator 108. According to this structure, a load received by the support mount 107 is not directly passed onto the actuator 108, but is partially supported by the lower frame 141. That is, the support mount 107 and the actuator 108 are arranged effectively in parallel in a type of "telescopic" structure.

The upper frame 142 is positioned so as to surround the support mount 107, and the top of the support mount 107 makes contact with the top plate of the upper frame 142. A bar-shaped center shaft 143 is fixed to the center of the top surface of the support mount 107, and extends in the Z direction (along the line of action of the mount 107). A circular orifice 144 with a diameter slightly larger than the center shaft 143 is formed at the center of the top plate of the upper frame 142, so that the center shaft 143 can move vertically. The center shaft 143 passes through this orifice 144 and protrudes slightly from the top plate of the upper frame 142. The top plate of the upper frame 142 is fixed to the mounting plate 106 in FIG. 1, and accordingly, the thrust of the actuator 108 is transmitted to the mounting plate 106 through the upper frame 142.

The center of the support mount 107 and the center of the actuator 108 are aligned in a line substantially parallel to the Z axis. The top plate of the upper frame 142, which transfers the thrust of the actuator 108, is structured so as to be movable along the center shaft 143. The thrust center line S1 of the actuator 108 coincides with the center shaft 143, which is the line of action S2 of the support mount 107. Here, the lower frame 141 (which supports the support mount 107 on the base frame 102 in FIG. 1), the upper frame 142 (which transfers the thrust of the actuator 108), and the center shaft 143 of the support mount are each composed of nearly rigid materials. As for the spring material for the support mount 107, general structural springs or viscous fluid, such as oil or the like, can be used instead of air.

Next, the overall operation of the vibration isolator according to the present embodiment will be described. The vibration status of the exposure apparatus body 130 is detected by the three acceleration sensors 132A to 132C installed on the mounting plate 106. Based on the vibration level detected, vibration of the exposure apparatus body 130 is suppressed by controlling the thrusts of the three actuators 131A to 131C and the thrusts of the actuators in the four vibration isolation mounts 103A to 103C and the one not shown (the thrust of the actuator 108 in the vibration isolation mount 103A, for example).

The operation of the sensors detecting the vibration status of the exposure apparatus body 130 will be described in detail. The exposure apparatus body 130 vibrates under the effect of the external vibration coming through the base frame 102 from a floor (the surface of the base frame or the floor can be regarded as an installation surface), and/or the internal vibration originating from the motion of the stage, such as the reticle stage 127, the wafer stage 120, or the like, inside the exposure apparatus body 130. The accelerations of the exposure apparatus body 130 are detected by the acceleration sensors 132A to 132C at their respective locations. As shown in FIG. 2, the acceleration sensor 132A detects the acceleration $G_{XA}$ in the X direction, the acceleration $G_{YA}$ in the Y direction, and the acceleration $G_{ZA}$ in the Z direction, and the acceleration sensor 132B detects the acceleration $G_{YB}$ in the Y direction and the acceleration $G_{ZB}$ in the Z direction. In addition, the acceleration sensor 132C detects the acceleration $G_{ZC}$ in the Z direction. These detected acceleration data are supplied to the computation unit 113, and the computation unit 113 calculates the vibration status of the exposure apparatus body 130 according to the data.

In addition to the three degrees of freedom of the translational acceleration $G_{XA}$, $G_{YA}$, and $G_{ZA}$ detected by the acceleration sensor 132A, the rotational acceleration (angular acceleration) $G_{XY}$ of the exposure apparatus body 130 in the XY plane (around the Z axis) is derived from the two Y direction accelerations $G_{YA}$ and $G_{YB}$ detected by the acceleration sensors 132A and 132B, respectively. In addition, the angular acceleration $G_{ZX}$ of the exposure apparatus body 130 in the rotational direction in the ZX plane (around the Y axis) is derived from the two translational accelerations $G_{ZA}$ and $G_{ZB}$ along the Z direction detected by the acceleration sensors 132A and 132B, respectively. Likewise, the angular acceleration $G_{ZY}$ of the exposure apparatus body 130 in the rotational direction in the ZY plane (around the X axis) is derived from the two translational accelerations $G_{ZA}$ and $G_{ZC}$ along the Z direction detected by the acceleration sensors 132A and 132C, respectively. That is, all of the six degrees of freedom $G_{XA}$, $G_{YA}$, $G_{ZA}$, $G_{XY}$, $G_{ZX}$, and $G_{ZY}$ for the acceleration of the exposure apparatus body 130 (three degrees of freedom for the translational direction and the other three degrees of freedom for the rotational direction) are determined by the three acceleration sensors 132A to 132C.

The computation unit 113 calculates the thrusts necessary for the actuators to eliminate the vibration of the exposure apparatus body 130. The calculation uses parameters (gains or the like) stored in the memory unit 112 and the vibration (acceleration) data obtained above. The results are supplied to the control unit 111. The control unit 111 drives the actuators in the vibration isolation mounts (103A to 103C and the one not shown) in the Z direction, two actuators 131A and 131B in the Y direction, and one actuator 131C in the X direction based on these results. Through this, it becomes possible to efficiently eliminate vibration having six degrees of freedom in the exposure apparatus body 130. In the present embodiment described above, only three acceleration sensors 132A to 132C are necessary, and hence only three locations are required as the installation sites for the acceleration sensors in the exposure apparatus. Thus, it becomes possible to utilize space efficiently.

Figure 5:
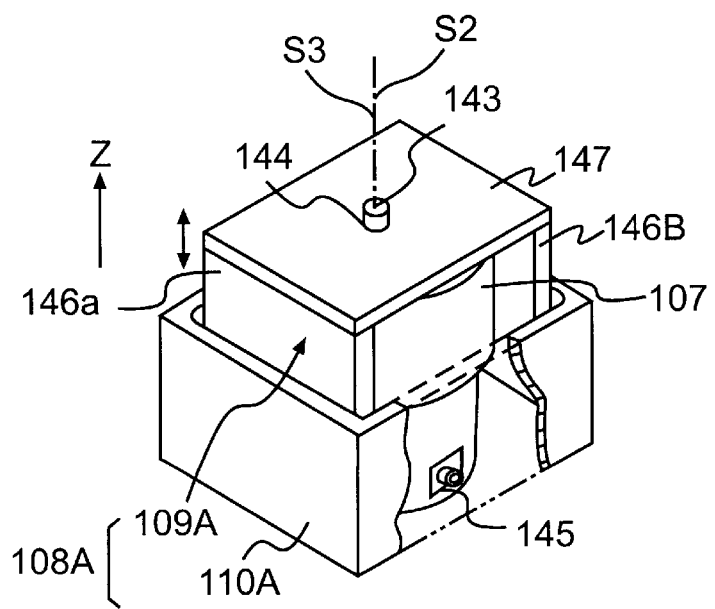
FIG. 5 is a perspective view showing the structure of the vibration isolator according to a third preferred embodiment of the present invention.

The vibration isolation mounts according to the present embodiment are installed between the exposure apparatus body 130 and the base frame 102, and are constructed by combining a support mount 107, which supports the exposure apparatus body 130 and an actuator 108 that generates a thrust in the vertical direction (the Z direction). With reference to FIGS. 4 and 5, if the support mount and the actuator are merely disposed in parallel, the line of action S2 of the support mount would likely change as the thrust of the actuator changes, and because of this, the thrust center line S1 of the actuator 108 deviates from a direction normal to the mounting plate 106. Therefore, undesirable deformation may occur in the mounting plate 106. To solve this problem, the present embodiment arranges the support mount 107 and the actuator 108 to form a kind of "telescopic" structure in such a way that the line of action S2 of the support mount 107 always coincides with the thrust center line S1 of the actuator 108. Through this, the thrust of the actuator 108 and the reaction force of the support mount 107 are aligned with the same line of action even when the thrust (stroke) of the actuator 108 changes. Consequently, the thrust of the actuator 108 is efficiently transferred to the mounting plate 106 and the undesirable deformation of the mounting plate 106 can be substantially eliminated.

Second Preferred Embodiment

Next, a second preferred embodiment of the present invention will be described with reference to FIG. 3. In this embodiment, assignment of the measurement directions and the number of degrees of freedom to the three acceleration sensors are different from that of the first preferred embodiment. The remainder of the composition is the same as that of the first embodiment. Common parts in FIGS. 2 and 3 are labeled with the same symbols, so repeated description of such is omitted here.

Figure 3:
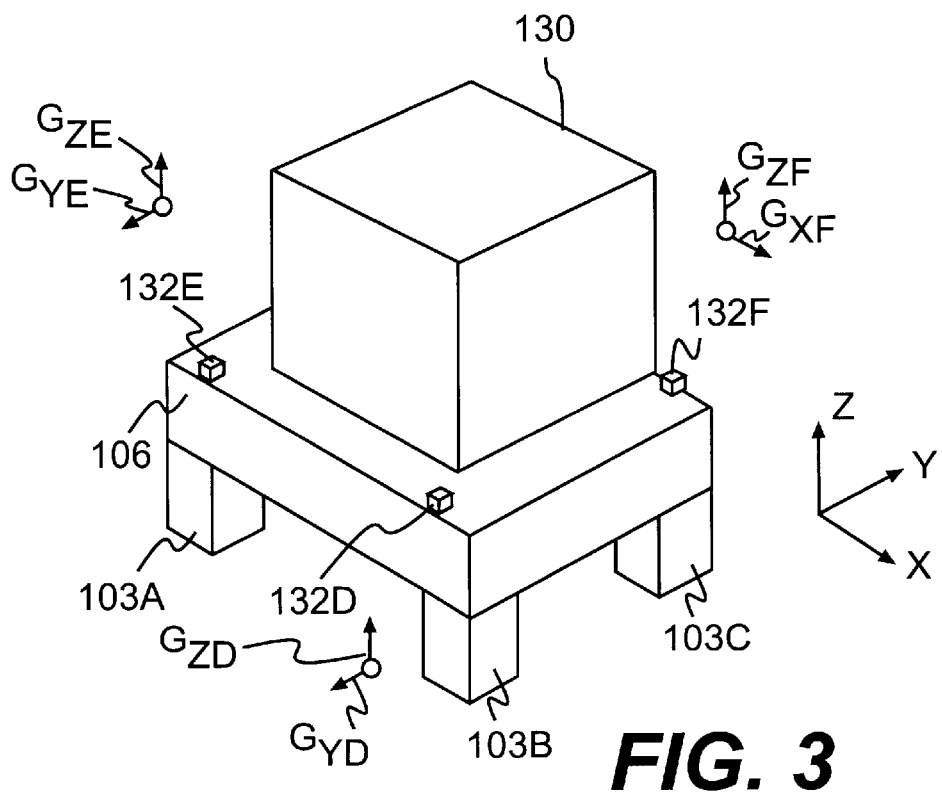
FIG. 3 is a perspective view showing the measurement direction and arrangement of acceleration sensors according to a second preferred embodiment of the present invention.

FIG. 3 is a perspective view showing the arrangement of sensors on the mounting plate 106 in the present embodiment. In FIG. 3, three acceleration sensors 132D to 132F are located in the same positions as the accelerations sensors 132A to 132C in FIG. 2. As shown in FIG. 3, the acceleration $G_{YD}$ in the Y direction and the acceleration $G_{ZD}$ in the Z direction of the exposure apparatus body 130 are detected by the acceleration sensor 132D. The acceleration $G_{YE}$ in the Y direction and the acceleration $G_{ZE}$ in the Z direction of the exposure apparatus body 130 are detected by the acceleration sensor 132E, and the acceleration $G_{XF}$ in the X direction and the acceleration $G_{ZF}$ in the Z direction of the exposure apparatus body 130 are detected by the acceleration sensor 132F. Furthermore, the angular acceleration $G_{ZK}$ of the exposure apparatus body 130 in the XY plane (around the Z axis) is derived from the two accelerations $G_{YD}$ and $G_{YE}$, and the angular acceleration $G_{YK}$ of the exposure apparatus body 130 in the ZX plane (around the Y axis) is derived from the two accelerations $G_{ZD}$ and $G_{ZE}$. In addition, the angular acceleration $G_{XK}$ of the exposure apparatus body 130 in the ZY plane (around the X axis) is derived from the two accelerations $G_{ZD}$ and $G_{ZF}$. That is, the acceleration of the exposure apparatus body 130 having a total of six degrees of freedom (three degrees of freedom for the translational direction and the other three degrees of freedom for the rotational direction) are all determined by the three acceleration sensors 132D to 132F. Here, the number of required acceleration sensors is three, the same as in the first preferred embodiment.

Third Preferred Embodiment

Referring now to FIG. 5, a third preferred embodiment of the present invention will be described. This embodiment provides a more compact structure of the vibration isolation mount than that in the first embodiment. Common parts in FIGS. 4 and 5 are labeled with the same symbols, so repeated description of such is omitted here. FIG. 5 is a perspective view showing the structure of the vibration isolation mount of the present embodiment. As shown in FIG. 5, a voice coil motor type actuator 108A is composed of a movable element 109A and a stationary element 110A, and is adapted to house a support mount 107. Both the stationary element 110A having a rectangular coil therein and the support mount 107 are fixed directly on the base frame 102 shown in FIG. 1. The movable element 109A has two magnetic, parallel plates 146a, 146b disposed to be movable along the two inner surfaces of the stationary element 110A. The tops of these movable elements 146a and 146b are fixed to a top plate 147. The top plate 147 is fixed to the mounting plate 106 of FIG. 1.

The top of the support mount 107 makes contact with the bottom surface of the top plate 147. As in FIG. 4, an orifice 144 is formed at the center of the top plate 147 and a rod-shaped center shaft 143 extending in the Z direction from the top of the top plate 107 protrudes from the orifice 144. The movable element 109A moves vertically with respect to the stationary element 110A by flowing the electric current in the coil of the stationary element 110A of the actuator 108A. The resultant thrust is applied to the mounting plate 106 via the top plate 147 of the movable element 109A. In this case, the center of the support mount 107 and the center of the actuator 108A substantially coincide with each other and the top plate 147 of the movable element 109A moves along the center shaft 143 of the support mount 107. Consequently, the thrust center line S3 of the actuator 108A coincides with the center shaft 143 of the support mount 107 (the line of action S2 of the mount 107). Here, the top plate 147 is composed of substantially rigid materials. The present embodiment has the support mount 107 positioned directly on the base frame 102 in comparison to the first preferred embodiment of FIG. 4.

Consequently, the stability of the vibration isolator mount is further enhanced and the deformation of the mounting plate 106 is effectively eliminated.

Fourth Preferred Embodiment

Figure 6A:
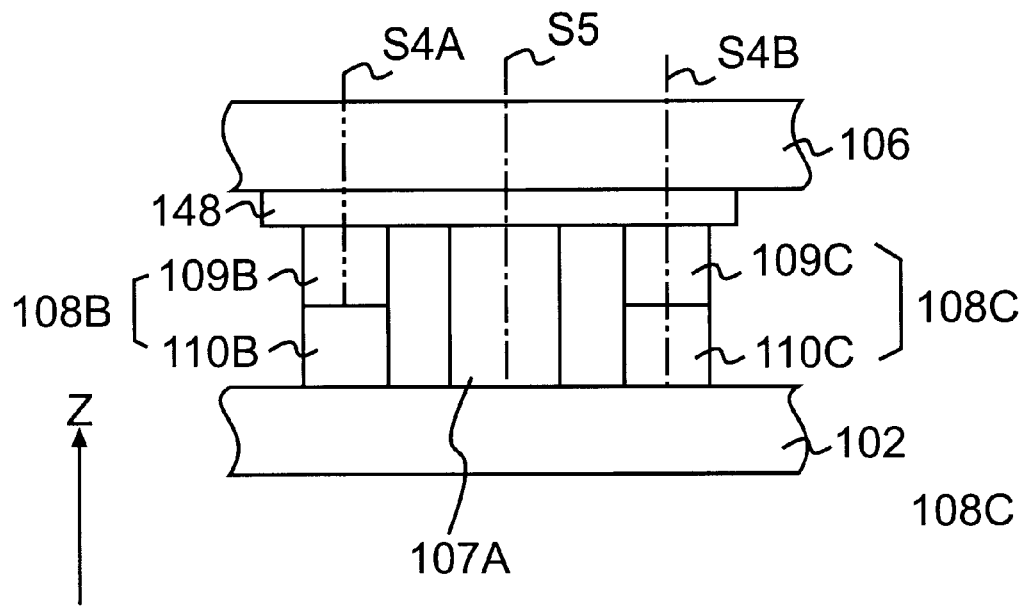
FIGS. 6A and 6B are perspective views showing vibration isolators according to fourth and fifth preferred embodiments of the present invention, respectively.

With reference to FIG. 6A, a fourth embodiment of the present invention will be described. This embodiment has two actuators in parallel adjacent to a support mount. These actuators are adapted such that the combined thrust center line of the two actuators coincides with the line of action of the support mount. In FIG. 6A, two actuators 108B and 108C having the thrust center lines parallel to the Z axis are disposed next to a support mount 107A. The support mount 107A and the two actuators 108B and 108C are all anchored onto the base frame 102. The stationary elements 110B and 110C of the actuators 108B and 108C are anchored to the base frame 102, and the movable elements 109B and 109C are fixed to a support member 148 that transfers the thrusts of the actuators to the mounting plate 106. The top of the support mount 107A makes contact with the support member 148 and bears the load of the exposure apparatus body 130 exerted through the support member 148. In this case, the thrusts of the two actuators 108B, 108C along the respective thrust center lines S4A and S4B are controlled such that the combined thrust center line coincides with the line of action S5 of the support mount 107A.

Fifth Preferred Embodiment

Figure 6B:
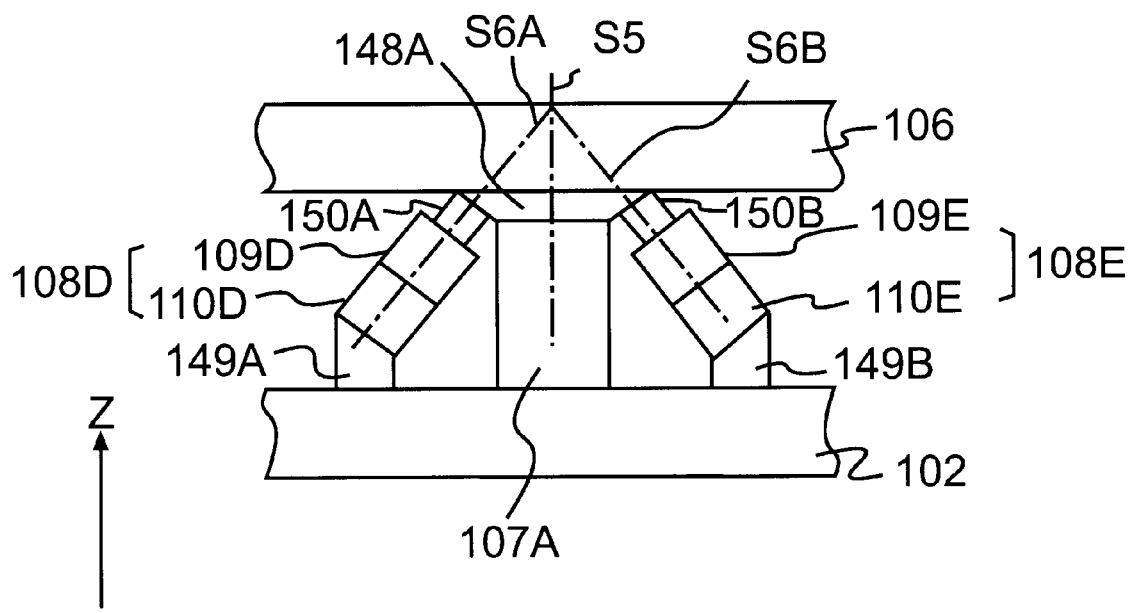

Referring now to FIG. 6B, a fifth preferred embodiment of the present invention will be described. Two actuators 108D and 108E are installed adjacent to a support mount 107A fixed to the base frame 102. The thrust center lines of the actuators 108D, 108E are inclined toward the top of the support mount 107A. Stationary elements 110D and 110E of the actuators 108D and 108E are anchored to the base frame 102 through support members 149A and 149B, respectively. Movable elements 109D and 109E are fixed to a support member 148A through driving shafts 150A and 150B, respectively. Here, the thrust center lines S6A and S6B of the respective actuators 108D and 108E intersect with each other on the line of action S5 of the support mount 107A. Accordingly, the center line of the combined thrust of the two actuators 108D and 108E coincides with the line of action S5 of the support mount 107A.

The structures of the vibration isolation mounts shown in FIG. 6A and FIG. 6B above are particularly effective when the load of the exposure apparatus body 130 (object of vibration isolation) is extremely large, and when a very large thrust needs to be produced instantaneously.

With the vibration isolator according to the present invention, it becomes possible to detect the posture and movement status of the object of vibration isolation having the six degrees of freedom by installing only three detection sensors. Consequently, a smaller space is required for installing the detection sensors. In addition, when wiring signal cables, power supply cables, and the like necessary for the detection sensors, the amount of work, which conventionally had to be accomplished for six or more sensor positions, is reduced, thereby lowering the costs of the design and assembly stages of the production.

Also, when the number of degrees of freedom to be measured at each of the three detection sensors are 3, 2 and 1, the translational acceleration (velocity or displacement) having three degrees of freedom can be accurately detected by one detection sensor detecting three degrees of freedom. Also, by combining the measured values of the three detection sensors, the angular acceleration (angular velocity or rotational angles) having three degrees of freedom can be accurately derived.

Furthermore, when the number of degrees of freedom to be measured at each of the three detection sensors is 2, the same detection sensors can be used and the directions of the sensors need only be configured properly, thereby reducing the cost of detection sensors.

In addition, according to the vibration isolation mount of the present invention, the thrust of the actuator and the reaction force of the spring member of the support mount are lined up with the same line of action. Consequently, it is possible to reduce the elastic deformation of the mounting plate which supports the object of vibration isolation. Accordingly, the thrust of the actuators can be efficiently transferred to the mounting plate. Also, because the thrust center line of the actuator(s) need only coincide with the line of action of the spring member, the structure of the vibration isolation mount can be made simple and the apparatus costs can be reduced. Moreover, from the point of view of the object of vibration isolation (exposure apparatus body), the spring member and the actuator(s) function in the same way. Therefore, by using a combination of both the spring member and the actuator(s), it is possible to control the vibration of the object with high precision.

It is also possible to consider, for example, arranging the spring member and the actuator in series. However, quite a large amount of load (several hundred kg to 1 ton or more) is applied to the actuator in this case. This creates the problems of poor durability and heat generation. Hence, in the present invention, the spring member and the actuator are arranged essentially in parallel, while the line of action coincides with the thrust center line.

In the embodiments above, when detecting the vibration status of the apparatus, the accelerations may be computed using displacement sensors, instead of acceleration sensors, for example. This is possible because acceleration is the second derivative of the displacement. Conversely, the displacement may be obtained by integrating the accelerations detected by acceleration sensors if desired. Velocity sensors may be used in place of acceleration sensors. Any one of the physical parameters—displacement, velocity, and acceleration—can be used to characterize the vibration status of the exposure apparatus and to determine the position or posture of the apparatus.

Sixth Preferred Embodiment

A sixth preferred embodiment of the present invention will now be described with reference to FIGS. 7 to 11 in the case that the present invention is applied to a stepper type projection exposure apparatus.

Figure 7:
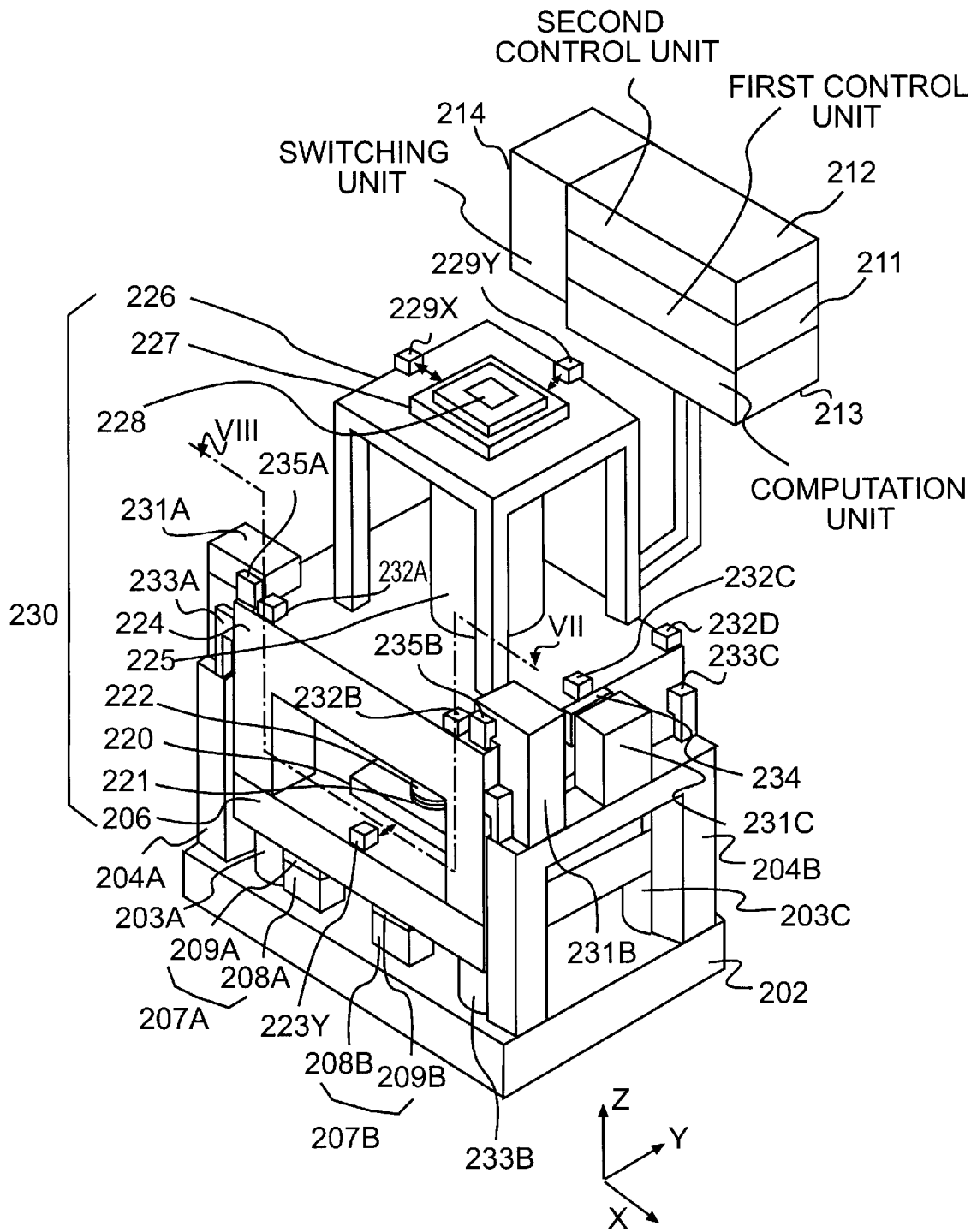
FIG. 7 is a perspective view showing overall structure of a projection exposure apparatus to which a sixth preferred embodiment of the present invention is applied.

FIG. 7 is a perspective view showing the overall structure of the projection exposure apparatus. In FIG. 7, four anti-vibration mounts 203A to 203D (only 203A to 203C are shown in FIG. 7. See FIG. 8 for 203D) are installed on a base frame 202 fixed on an installation floor or the like. A mounting plate 206 of the projection exposure apparatus is installed via these anti-vibration mounts 203A to 203D. In this embodiment, each of the anti-vibration mounts 203A to 203D is composed of a vertical movement mechanism fixed to the base frame 202, a vibration absorption system over the vertical motion mechanism, and a load sensor contacting with the mounting plate 206. Since a projection optical system 225 is used in the present embodiment, it is convenient to take the Z axis parallel to the optical axis of the projection optical system 225 and the X and Y axes in a plane perpendicular to the Z axis, as shown in FIG. 7.

Figure 8:
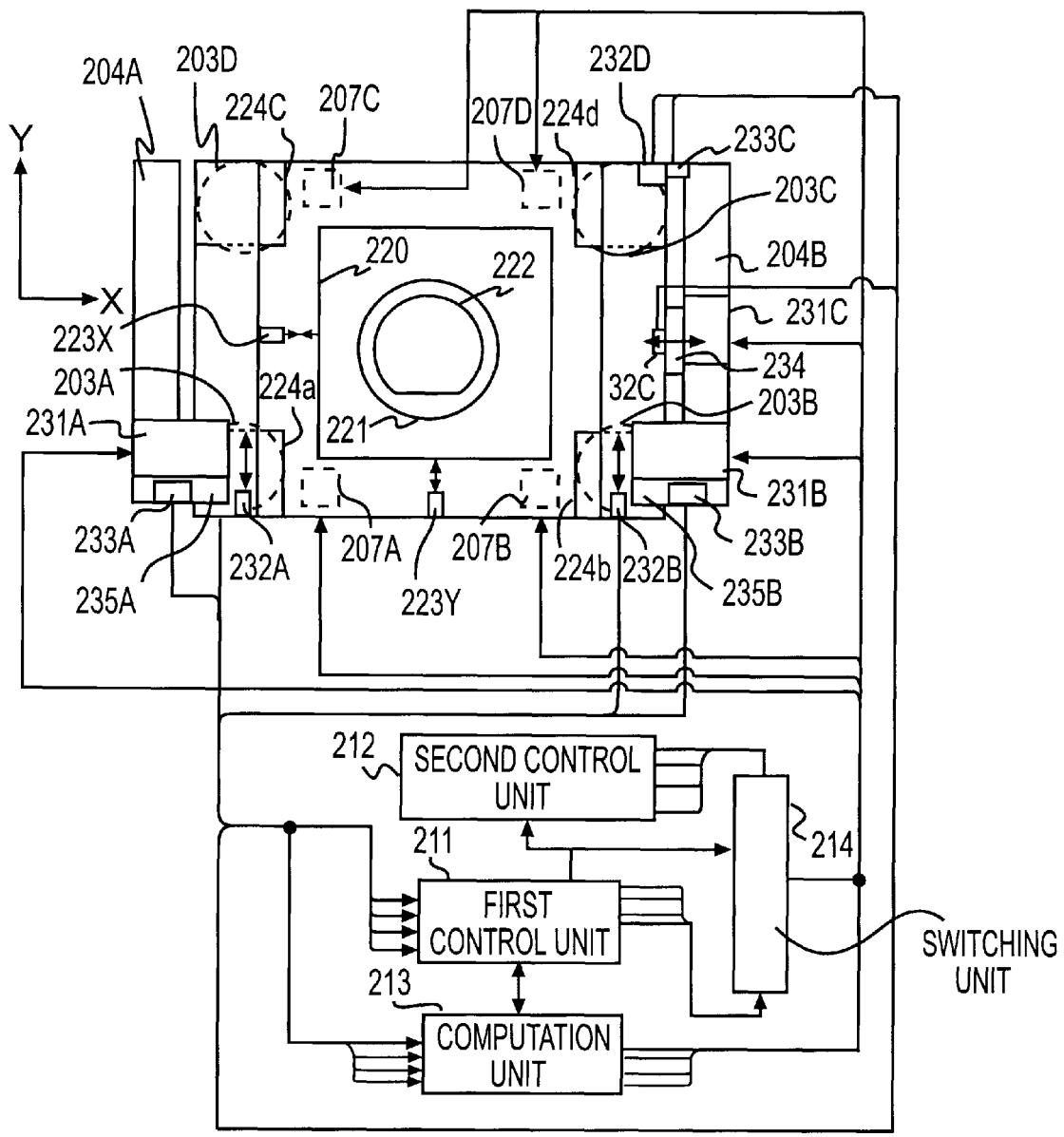
FIG. 8 is a cross-sectional view taken along line VIII—VIII in FIG. 7.

FIG. 8 shows a cross-sectional view taken along line VIII—VIII in FIG. 7. The line VIII—VIII in FIG. 7 is a line which advances laterally to the upper part of the apparatus, penetrates a first column 224 downward near the +X direction edge thereof, advances in the −X direction in the space just above a wafer 222, and penetrates the first column 224 upward near the −X direction edge thereof As shown in FIG. 8, the anti-vibration mounts 203A to 203D are each disposed near the four comers of the rectangular bottom surface of the mounting plate 206. These anti-vibration mounts 203A to 203D are controlled by a first control unit 211 which also controls the overall operation of the apparatus. Here, as will be described below, each of the vibration absorption systems in the anti-vibration mounts 203A to 203D is composed of a vibration absorption system made of a spring-like member, such as an air spring or mechanical spring, and a vibration absorption system made of viscous fluid. The vibration absorption system made of spring members will be referred to as a spring buffer system, while the vibration adsorption system made of viscose fluid will be referred to as a fluid buffer system.

Referring to FIG. 7, voice coil motor type actuators 207A, 207B are installed between the base frame 202 and the mounting plate 206 adjacent to the anti-vibration mounts 203A, 203B, respectively. The actuators 207A (207B) is composed of a stationary element 208A (208B) fixed on the base frame 202 and a movable element 209A (209B) fixed to the bottom surface of the mounting plate 206. The actuators 207A, 207B are normally controlled by the first control unit 211 through a switching uni 214, or are controlled by a second control unit 212 when the mechanical constants of an exposure apparatus body 230 are to be determined, as will be described below. The actuators 207A, 207B generate pushing forces directed from the base frame 202 toward the bottom surface of the mounting plate 206 in the Z direction or pulling forces directed from the bottom surface of the mounting plate 206 toward the base frame 202. Likewise, the actuators 207C, 207D are installed near the other anti-vibration mounts 203C, 203D in the same manner as in the anti-vibration mounts 203A, 203B (see FIG. 2). The pushing forces or pulling forces of these actuations are also controlled by the first control unit 211 or the second control unit 212. In the present embodiment, displacement in the Z direction, rotation around the X axes, and rotation around the Y axis of the mounting plate 206 are controlled by four actuators 207A to 207D. However, since the number of degrees of freedom to be controlled is 3 in this case, only three actuators must be installed.

A wafer stage 220 is installed on the mounting plate 206 and a wafer 222 is held on the wafer stage 220 via a wafer holder 221 by a vacuum chuck of the like. A first column 224 with four legs is installed so as to surround the wafer stage 220 on the mounting plate 206. Projection optical system 225 is installed at the center of the top plate of the first column 224. A second column 226 with four legs is installed on the top plate of the first column 224 to surround the projection optical system 225. A reticle 228 is mounted at the center of the top plate of the second column 226 via a reticle stage 227. As shown in FIG. 8, laser interferometers 223X, 223Y for measuring the position of the wafer stage 220 along the X and Y directions are installed near the edges of the top surface of the mounting plate 206 on the −X direction side and on the −Y direction side, respectively. The wafer stage 220 determines the motion in the Z direction, rotation around the Z direction, and leveling of the wafer 222, as well as performs positioning of the wafer 222 in the XY plane based on the measurement results of the laser interferometers 223X, 223Y.

Also, laser interferometers 229X, 229Y for measuring the position of the reticle stage 227 along the X and Y directions are installed near the edges of the top plate of the second column 226 on the −X direction side and on the +Y direction side, respectively. The reticle stage 227 adjusts the rotational angle and conducts fine adjustment of the two dimensional position of the reticle 228 according to the measurement results of the laser interferometers 229X, 229Y.

An illumination optical system (not shown in the figure) is placed above the reticle 228. Exposing radiation (exposing light or the like) coming from the illumination optical system illuminates the pattern on the reticle 228, passes through the projection optical system 225, and forms the image onto each shot area of the wafer 222. Here, an exposure apparatus body 230 is defined by the reticle stage 227, the wafer stage 220, and the first and the second columns 224, 226 which support these stages.

As shown in FIG. 8, the first column 224 is installed on the mounting plate 206 by means of four legs 224a to 224d. An acceleration sensor 232A is installed near the −X and −Y direction corner of the top plate of the first column 224 to detect the acceleration of the first column 224 in the X, Y and Z directions. An acceleration sensor 232B is installed near the +X and −Y direction corner of the top plate of the first column 224 to detect the acceleration of the first column 224 in the Z direction. Moreover, acceleration sensors 232C, 232D are installed near the edge on the +X direction side, and near the +X and +Y direction corner of the top plate of the first column 224 to detect the acceleration of the first column 224 in the Y and Z directions, respectively. The results detected by the acceleration sensors 232A to 232D are supplied to the first control unit 211. These results detected by the acceleration sensors 232A to 232D are supplied also to a computation unit (calculator) 213 when the mechanical constants of the exposure apparatus body 230 are to be obtained. The first column 224 is installed on the mounting plate 206, and thus, the detected acceleration of the first column 224 can be regarded as the acceleration of the mounting plate 206.

In addition to translational acceleration having three degrees of freedom, which is measured by the acceleration sensor 232A, the acceleration in the rotational direction (angular acceleration) of the mounting plate 206 in the XY plane (around the Z axis) is derived from the two accelerations in the Y direction obtained by the acceleration sensors 232A, 232C. Also, the angular acceleration of the mounting plate 206 in the ZX plane (around the Y axis) is derived from the two accelerations in the Z direction detected by the acceleration sensors 232A, 232B, and the angular acceleration of the mounting plate 206 in the ZY plane (around the X axis) is derived from the two accelerations in the Z direction obtained by the acceleration sensors 232B, 232D. This way, the acceleration of the entire exposure apparatus body 230 having six degrees of freedom is determined by the acceleration sensors 232A to 232D.

Here, the acceleration may be computed solely from the output of the displacement sensors 233A to 233C (will be described below), without using the acceleration sensors 232A to 232D, for example. This is possible because acceleration is the second derivative of the displacement, as noted above. Conversely, the displacement may be obtained by integrating accelerations detected by the acceleration sensors 232A to 232D without having the displacement sensors 233A to 233C. Also, velocity sensors may be used in place of the acceleration sensors 232A to 232D.

Block U-shaped support pillars 204A and 204B that can be considered rigid bodies are provided near the edges of the base frame 202 on the −X direction and +X direction sides. Near the edge of the top of the support pillar 204A on the −Y direction side, a voice coil motor type actuator 231A is installed. The actuator 231A is composed of a stationary element and a movable element 235A. The stationary element has a coil installed therein. The movable element 235A is made of magnetic material and anchored to the top plate of the first column 224. By controlling the current flowing in the coil in the stationary element of the actuator 231 A, it is possible to apply a force to the movable element 235A in the ±Y directions.

Similarly, near the edge of the top plate of the support pillar 204B on the −Y direction side, an actuator 231B similar to the actuator 231A is installed. The actuator 231B generates a force in the ±Y directions to a movable element 235B fixed to the top plate of the first column 224. Also, near the center of the top plate of the support pillar 204B, an actuator 231C is provided to generate a force in the ±X directions to a movable element 234. The movable element 234 is composed of magnetic material and is fixed to the side surface of the first column 224 facing the actuator 231C.

The actuators 231A to 231C are controlled by the first control unit 211 or the second control unit 212 according to the switching unit 214. The first control unit 211 or the second control unit 212 controls the driving forces of the actuators 231A to 231C to the corresponding movable elements 235A, 235B, and 234. In the present embodiment, the displacement of the exposure apparatus body 230 in the Y direction and the angle of rotation thereof around the Z axis are controlled by the actuators 231A, 231B, and the displacement in the X direction is controlled by the actuator 231C.

At the edge of the top plate of the support pillar 204A on the −Y direction side, a displacement sensor 233A is installed to detect the displacement of the first column 224 in the X Y, and Z directions. Likewise, at the edge of the top plate of the support pillar 204B on the −Y direction side, a displacement sensor 233B is installed to detect the displacement of the first column 224 in the Y and Z directions. At the edge of the top plate of the support pillar 204B on the +Y direction side, a displacement sensor 233C is installed to detect the displacement of the first column 224 in the Z direction. The results detected by these three displacement sensors 233A to 233C are supplied to the first control unit 211. When the mechanical constants of the exposure apparatus body 230 are to be obtained, the results detected by the sensors 233A to 233C are supplied to the computation unit 213. The first column 224 is fixed on the mounting plate 206, and thus, the detected displacement of the first column 224 can be regarded as the displacement of the mounting plate 206.

The translational displacement of the mounting plate 206 having three degrees of freedom is detected by the displacement sensor 233A. The angle of rotation of the mounting plate 206 in the XY plane (around the Z axis) is derived from the two displacement values in the Y direction measured by the displacement sensors 233A, 233B. The angle of rotation of the mounting plate 206 in the XZ plane is derived from the two displacement values in the Z direction measured by the displacement sensors 233A, 233B. Likewise, the angle of rotation of the mounting plate 206 in the YZ plane is derived from the two displacement values in the Z direction measured by the displacement sensors 233B, 233C. This way, the displacement of the mounting plate 206 in all the directions (six degrees of freedom) is determined by the displacement sensors 233A to 233C. Here, a potentiometer having about 0.1 mm resolution, a photo-electric type linear encoder, or the like may be used as the displacement sensors 233A to 233C.

Now, the operation of the vibration isolator according to the present embodiment will be described. In the present embodiment, predetermined driving signals are inputted to predetermined actuators prior to actual exposure operation. Then the resultant changes in posture and vibration of the exposure apparatus body 230 in response to such external disturbance are monitored.

Figure 9:
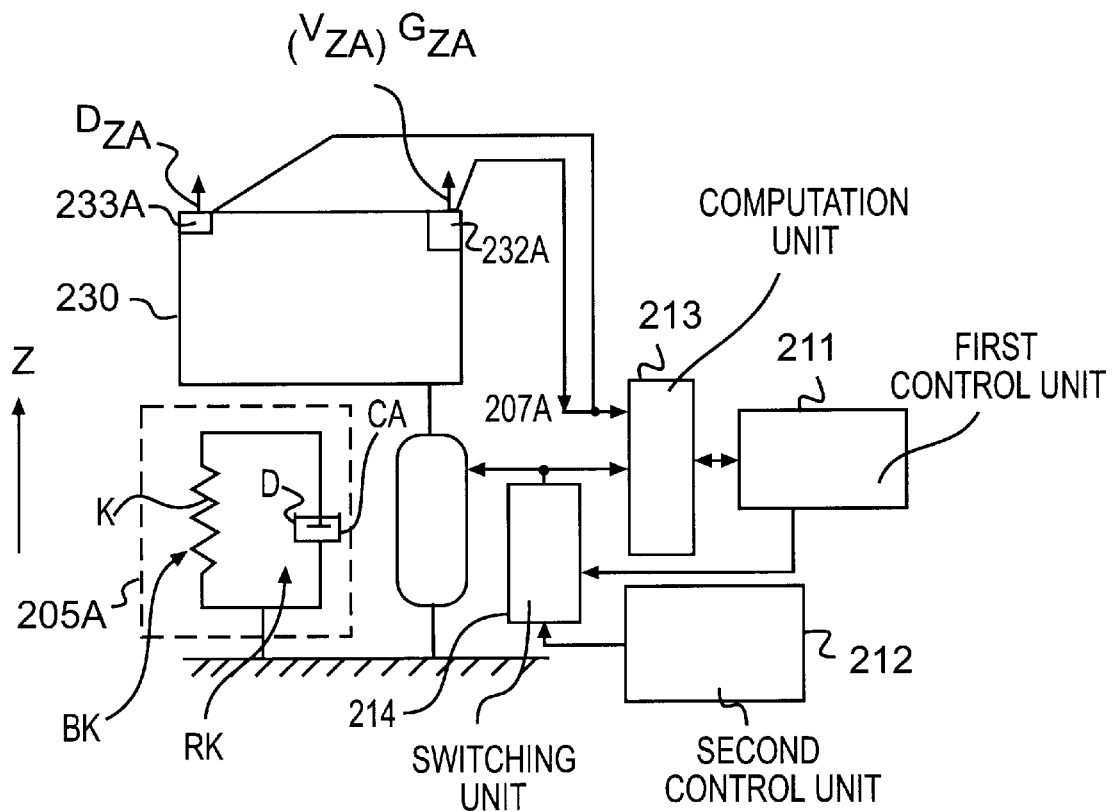
FIG. 9 is a block diagram describing the operation of a vibration isolator according to the sixth preferred embodiment of the present invention.

FIG. 9 is a block diagram showing the vibration isolator of the present embodiment. FIG. 9 shows a simplified operation model, which controls the displacement (vibration) of the exposure apparatus body 230 of FIG. 7 only in the Z direction. Also, the displacement sensor 233A and the acceleration sensor 232A of FIG. 7 are shown as if they are embedded in the main body of the exposure apparatus 230. Here, a velocity sensor may be used in place of the acceleration sensor 232A as noted above, and the following explanation is applicable for both cases.

In FIG. 9, a portion enclosed by a dotted rectangle represents a vibration absorption system 205A corresponding to the anti-vibration mount 203A in FIG. 7, for example. The vibration absorption system 205A is a vibration buffer system composed of a spring buffer system BK made of a spring K (air spring, for example) and a fluid buffer system RK made of viscous fluid D, such as damper oil, filled in a predetermined container CA. When the switching unit 214 selects the second control unit 212 over the first control unit 211, predetermined driving signals are outputted from the second control unit 212 to the actuator 207A through the switching unit 214. In this case, these driving signals are also supplied to the computation unit 213 through the switching unit 214, and are stored therein. The exposure apparatus body 230 moves in the Z direction in response to the thrust of the actuator 207A driven by the driving signals from the second control unit 212. In the case shown in FIG. 9, the exposure apparatus body 230 is moved by an amount $D_{ZA}$ in the Z direction at the position of the displacement sensor 233A. The displacement sensor 233A detects the Z direction displacement $D_{ZA}$ and supplies the result to the computation unit 213, and the displacement $D_{ZA}$ is stored in the computation unit 213. At the same time, data representing acceleration $G_{ZA}$ (or velocity $V_{ZA}$) of the exposure apparatus body 230 at the position of the acceleration sensor 232A is supplied from the acceleration sensor 232A to the computation unit 213, and is stored therein.

In a real system, data representing displacement $D_{XA}$ in the X direction and displacement $D_{YA}$ in the Y direction of the exposure apparatus body 230 are also supplied from the displacement sensor 233A to the computation unit 213. Acceleration $G_{XA}$ (or velocity $V_{XA}$) in the X direction, and acceleration $G_{YA}$ (or velocity $V_{YA}$) in the Y direction are also supplied from the acceleration sensor 232A to the computation unit 213. Moreover, data representing the displacement $D_{YB}$ in the Y direction and displacement $D_{ZB}$ in the Z direction at the position of the displacement sensor 233B are also supplied to the computation unit 213 from this sensor 233B, and displacement $D_{ZC}$ in the Z direction at the position of the displacement sensor 233C is supplied to the computation unit 213 from the displacement sensor 233C. Furthermore, acceleration $G_{ZB}$ (or velocity $V_{ZB}$) in the Z direction, acceleration $G_{YC}$ (or velocity $V_{YC}$) in the Y direction, and acceleration $G_{ZD}$ (or velocity $V_{ZD}$) in the Z direction are also supplied to the computation unit 213 from the other sensors 232B to 232D, respectively. All of these data are stored in the computation unit 213.

Similar operations are repeated with different thrusts of the actuator 207A by changing the driving signal of the actuator 207A through the second control unit 212. Data representing displacement, velocity, or acceleration of the exposure apparatus body 230 in response to various driving signals for the actuator 207A are supplied to the computation unit 213, and are stored therein. Similar operations are performed for the other five degrees of freedom. The detected data are also supplied to the computation unit 213, and are stored therein. After completing this sequence, the computation unit 213 calculates accurate mechanical constants, such as the position of centroid, weight, moment of inertia (the case of controlling the rotational angle) and the principal axis of inertia, based on the measured data supplied.

Figure 10:
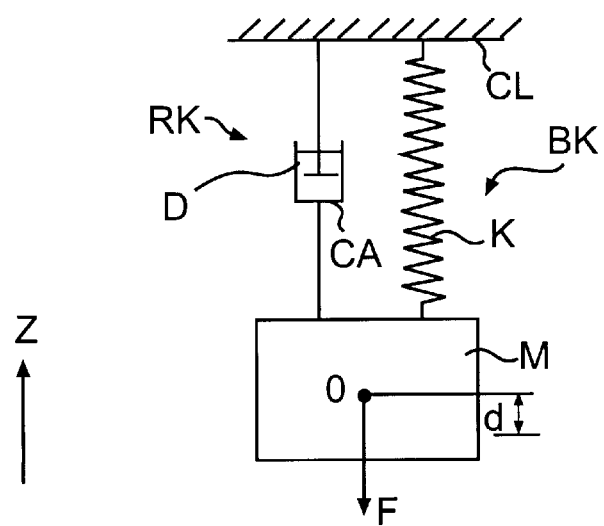
FIG. 10 is a drawing describing a vibration model of one mass point system for explanation of the sixth preferred embodiment of present invention.

FIG. 10 shows a vibration model of a one mass point system; a simplest example for determining the mechanical constants corresponding to the operation model in FIG. 9. In this example, a mass point M corresponding to the exposure apparatus body 230 is suspended from a rigid ceiling CL through a fluid buffer system RK consisting of viscous fluid D filled in a predetermined container CA and a spring buffer system BK consisting of a spring K. The constituent elements in this example are the mass point M, the spring K, and the viscous fluid D. Their characteristics are determined by mass m, the spring constant k, and the coefficient of viscosity c, respectively. When a downward (in the negative Z direction) force F, for example, is exerted externally to the mass point M of this vibration model, the mass point M starts oscillating vertically with displacement d changing in the course of the oscillation.

Figure 11A:
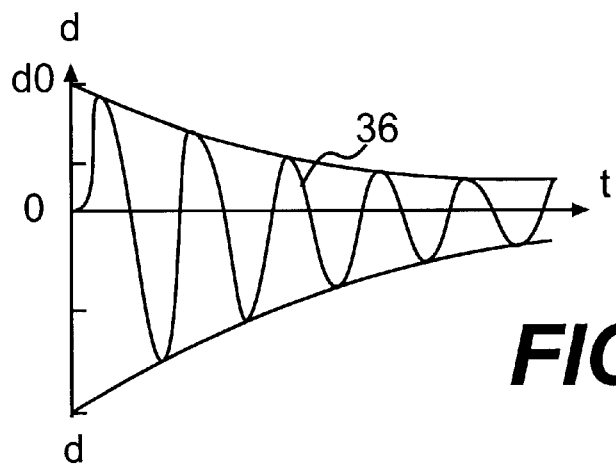
FIGS. 11A, 11B, and 11C are drawings showing the damping characteristics of mass point M in the vibration model of FIG. 10.
Figure 11B:
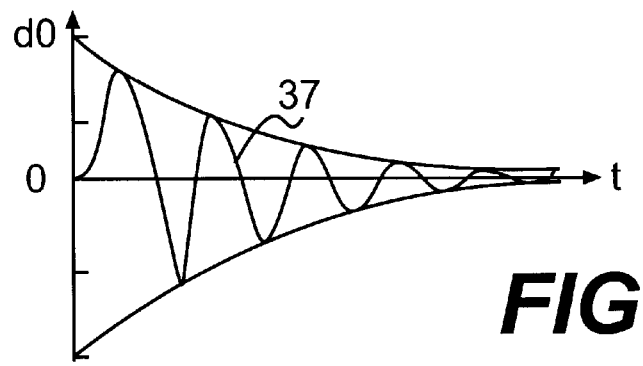
Figure 11C:
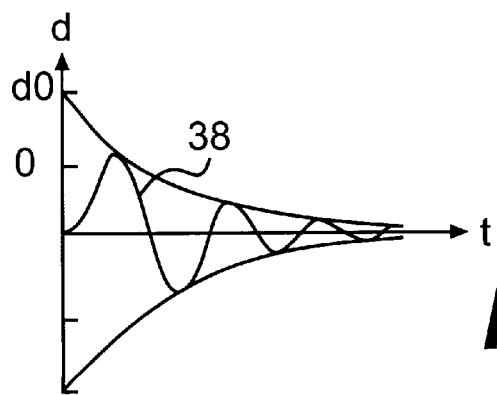

FIGS. 11A to 11C show the oscillation damping characteristics of the mass point M with the same initial displacement $d_0$ and three different damping ratios. In FIGS. 11A to 11C, the horizontal axis represents time t and the vertical axis represents displacement d. FIG. 11A is the case where the damping ratio h is 0.05. The curve 36 shows that the oscillation (vibration) does not attenuate quickly because the damping ratio h is relatively small. FIG. 11B is the case where the damping ratio is 0.1. The curve 37 shows that the oscillation (vibration) attenuates relatively quickly because the damping ratio h is larger than that of FIG. 11A. Furthermore, in the case of FIG. 11C where the damping ratio h is 0.2, the curve 38 shows that the oscillation (vibration) attenuates more quickly because the damping ratio h is the largest.

As described in FIGS. 11A to 11C above, damping characteristics (or the damping curves) of the vibration of the mass point M differ depending on the damping ratio h. If the mass m of the mass point M is known, the spring constant k and the coefficient of viscosity c (or damping ratio h) can be computed from the damping curve of displacement d. Conversely, if the spring constant k and the coefficient of viscosity c (or damping ratio h) are known, the mass m can be determined through measuring the damping characteristics of displacement d.

As described above, the actual exposure apparatus is a more complicated vibrating system, and rotational components as well as translational components must be taken into consideration as degrees of freedom of vibration. The vibrating body itself normally has a structure having a moment of inertia rather than a single mass point. Nonetheless, if the accurate spring constants and the coefficients of viscosity (or damping coefficient) for the anti-vibration mounts 203A to 203D are known, the mechanical constants, such as the location of centroid, principal axis of inertia, the mass, and the moment of inertia, can be obtained in a similar manner to the vibration model of FIG. 10 by measuring the vibration status for all degrees of freedom including rotational components.

These measured mechanical constants are used in deriving parameters necessary for calculating the driving amount (thrust or stroke) of each actuator when performing high precision vibration control. Gains for setting driving signals of actuators 207A to 207D, 231A to 231C are such parameters, for example. These gains are calculated in the computation unit 213 of FIG. 7, using the measured mechanical constants. Resultant parameters are supplied from the computation unit 213 to the first control unit 211 at a command from the first control unit 211, and are stored in a memory device in the first control unit 211. During actual exposure operation, the first control unit 211 computes the driving signal (thrust) of each actuator based on these stored parameters and real-time vibration information monitored by sensors (displacement sensors 233A to 233C and the acceleration sensors 232A to 232D), and controls each actuator accordingly.

The mechanical constants obtained by the sequence above are actually measured values. Since the parameters (gains or the like) used in determining the thrust of the actuators are computed from these actually measured values, vibration control of the exposure apparatus body 230 can be executed more effectively than the conventional control.

Next, various application methods of the present embodiment during actual operation of an exposure apparatus are described. In the first application method, the parameters used in deriving the thrust of the actuators are determined only once immediately after the assembly of the exposure apparatus. Executing the sequence described above, the parameters are calculated using the measured mechanical constants, such as weight, the centroid, moment of inertia, and the principal axis of inertia. The values of the parameters and the measured mechanical constants are stored in a memory device of the first control unit 211 and are used by the first control unit 211 in computing the driving amount of each actuator. In this case, however, a similar sequence is needed even after the assembly if some modification or addition of elements is made to the exposure apparatus.

The second application method is to program the sequence of the present embodiment in the initializing operation of the exposure apparatus (and/or the vibration isolator), i.e., when the power supply is turned on. This way, the first control unit 211 can accommodate any changes in the exposure apparatus that may have occurred since the previous use of the apparatus; the obtained parameters are adjusted to such changes.

The third application method is to store many sets of the parameters corresponding to the various positions of the movable elements in the exposure apparatus, such as reticle stage 227 and wafer stage 220 of the exposure apparatus body 230. The weight of a stage, such as reticle stage 227 and wafer stage 220, ranges from several dozen kg to more than one hundred kg, and thus accounts for several percentages of the entire weight of the exposure apparatus. Hence, these weights cannot be ignored when high-performance vibration isolation is required. For this reason, it is preferable to compute and store the parameters for the entire range of the wafer stage motion, for example. However, this is not practical because an enormous amount of time and memory space are required to obtain and store such a large amount of data. However, in the case of exposure apparatus, precise and accurate parameters are necessary only at the moment of exposure. Hence, it is sufficient to know the parameters for the case that shot areas on the wafer 222 are aligned with the exposure area of the projection optical system 225. In the case of an 8-inch wafer, for example, the number of shot areas is at most about 70. Thus, it is practical to obtain the parameters for all the shot areas.

Alternatively, the parameters used for obtaining the driving amount of each actuator is determined when the wafer stage 220 is located at specific coordinate positions—with respect to the stage coordinate system. Hence, each parameter can be represented as an appropriate function of the stage coordinate system. Coefficients defining the function can be accurately computed by measuring and computing the parameter over the entire range of operation of the exposure apparatus. Once the coefficients are determined, it becomes possible to derive the parameter for each stage position using the function without referring to actual measured data. This eliminates a need to store numerous data in the memory unit as in the case of the third application method above. This method is applicable to the first and second application methods.

Next, an algorithm for applying the parameters obtained by the above method to actual exposure operation will be described. First of all, switching is executed in the switching unit 214 so that the operations of actuators can be controlled by the first control unit 211. Information of acceleration having six degrees of freedom detected by the acceleration sensors 232A to 232D and information on displacement having six degrees of freedom measured by displacement sensors 233A to 233C are supplied to the first control unit 211. Parameters used in determining the driving amounts of the actuators are obtained by one of the examples described above and already supplied to the first control unit 211. The first control unit 211, using these parameters, drives four Z direction actuators 207A to 207D, two Y direction actuators 231A, 231B, and one X direction actuator 231C, so that vibration (acceleration and displacement) having six degrees of freedom can be eliminated. Accordingly, vibration having six degrees of freedom generated in the exposure apparatus body can be promptly stopped.

In all of the embodiments above, the present invention was applied to a stepper-type projection exposure apparatus. The present invention can also be applied to a scanning exposure-type projection exposure apparatus employing a step-and-scan scheme or the like. Because a large acceleration is generated at the beginning of scanning exposure, an active-type vibration isolator equipped with actuators, which directly suppresses vibration as in the present invention, is particularly effective in the scanning exposure type apparatus.

Also, a programmed microcomputer, programmable logic array, or the like may be used for the control unit, computation unit, and/or switching unit appeared in the embodiments above.

According to the present invention, the accurate mechanical constants of the object of vibration isolation are obtained by externally generating vibration in the object using actuators (which are also used for isolating vibration), and by measuring the response of the object through detection sensors. Hence, the present invention has an advantage in that since the accurate mechanical constants of the object are determined, the vibration isolation devices such as actuators can be controlled with high accuracy. Moreover, separate measurement devices are not needed to obtain mechanical constants of the object.

Furthermore, when parameters being used in driving actuators in response to the output of the detection sensors are determined from the measured mechanical constants, the accurate parameters are obtained because accurate mechanical constants are used. As a result, it becomes possible to eliminate residual vibration.

Moreover, a vibration isolator according to the present invention has a further advantage in that if computation of the mechanical constants of the apparatus (the object of vibration isolation) and determination of the parameters for actuators are performed during the initialization stage of the apparatus (and/or the vibration isolator), optimal vibration suppression is achieved even if the condition or status of the apparatus changes.

Furthermore, a vibration isolator according to the present invention has highly efficient, effective vibration isolation capability, because the vibration control incorporates the accurate mechanical constants.

It will be apparent to those skilled in the art that various modifications and variations can be made in the vibration isolator and the method for isolating vibration of the present invention without departing from the spirit or scope of the invention. Thus, it is intended that the present invention cover the modifications and variations of this invention provided they come within the scope of the appended claims and their equivalents.

The entire disclosure of Japanese Patent Applications No, 8-42696 filed on Feb. 29, 1996 and No, 8-42697 filed on Feb. 29, 1996 including specification, claims, drawings and summary are incorporated herein by reference in its entirety.

What is claimed is:

1. A method for suppressing vibration of a body supported by an anti-vibration mount having a predetermined damping coefficient and a predetermined spring constant, the method comprising the steps of:

applying a predetermined force to the body;

detecting motion of the body generated in response to the predetermined force;

deriving a mechanical constant of the body from the detected motion of the body generated in response to the predetermined force;

monitoring the vibration of the body; and exerting a controlling force to the body in accordance with the monitored vibration of the body and the derived mechanical constant of the body to suppress the vibration of the body.

2. The method according to claim 1, wherein the step of applying comprises the step of momentarily applying the predetermined force to the body.

3. The method according to claim 2, wherein the step of applying includes the step of generating a predetermined displacement and a predetermined velocity of the body.

4. The method according to claim 1, wherein the step of detecting includes the step of detecting a displacement and an acceleration of the body.

5. The method according to claim 1, wherein the body includes an electric instrument, and the method further comprises the step of turning on a power of the electric instrument.

6. The method according to claim 1, wherein the step of monitoring includes the step of monitoring a displacement and an acceleration of the body.

7. The method according to claim 1, wherein the step of applying includes the step of applying the predetermined force to the body at a first point of the body;

the step of detecting includes the step of detecting the motion of the body generated in response to the predetermined force at a second point of the body;

the step of monitoring includes the step of monitoring the vibration of the body at the first point of the body; and the step of exerting includes the step of exerting the controlling force to the body at the second point of the body in accordance with the monitored vibration of the body and the derived mechanical constant of the body to suppress the vibration of the body.

8. The method according to claim 1, wherein the step of applying includes the step of engaging an actuator to the body at a first point of the body to apply the predetermined force to the body;

the step of detecting includes the step of detecting a motion of the body at a second point of the body generated in response to the predetermined force;

the step of monitoring includes the step of monitoring the vibration of the body at the second point of the body; and the step of exerting includes the step of engaging the actuator to the body at the first point of the body to exert the controlling force to the body in accordance with the monitored vibration of the body and the derived mechanical constant of the body to suppress the vibration of the body.

9. The method according to claim 8, wherein the step of exerting includes the steps of:

determining a parameter for operating the actuator in accordance with the derived mechanical constant of the body; and engaging the actuator to the body at the first point of the body to exert the controlling force to the body in accordance with the monitored vibration of the body and the determined parameter to suppress the vibration of the body.

10. The method according to claim 9, wherein the parameter includes a gain of the actuator.

11. The method according to claim 1, wherein the step of deriving includes deriving the mechanical constant of the body from the damping coefficient, the spring constant of the anti-vibration mount, and the detected motion of the body generated in response to the predetermined force.

12. A method for suppressing vibration of a body having at least six degrees of freedom supported by a plurality of anti-vibration mounts each having a predetermined damping coefficient and a predetermined spring constant, the method comprising the steps of:

applying a predetermined force at a predetermined point on the body;

detecting the motion of the body generated in response to the predetermined force;

repeating the steps of applying and detecting by changing at least one of the predetermined force and the predetermined position, the number of times the steps are repeated, the predetermined forces, and the predetermined positions being so designed as to acquire sufficient information for determining mechanical constants of the body with predetermined accuracy;

deriving the mechanical constants of the body from the damping coefficient and the spring constant of each of the anti-vibration mounts and the detected motions of the body generated in response to the respective predetermined forces;

monitoring the vibration of the body; and exerting controlling forces at a plurality of points of the body in response to the monitored vibration of the body in accordance with the derived mechanical constants of the body to suppress the vibration of the body.

13. The method according to claim 12, wherein the step of exerting includes the step of engaging a plurality of actuators to the body to exert the respective controlling forces to the body in response to the monitored vibration of the body in accordance with the derived mechanical constants of the body to suppress the vibration of the body.

14. The method according to claim 13, wherein the step of exerting further includes the step of determining a parameter for operating each of the actuators in accordance with the derived mechanical constants of the body.

15. The method according to claim 14, wherein each of the parameters includes a gain of the corresponding actuator.

16. The method according to claim 12, wherein the body includes a plurality of parts assembled, and the steps of applying, detecting, repeating, and deriving are performed immediately after assembly of the plurality of parts.

17. The method according to claim 12, wherein the body includes an electric instrument, and the steps of applying, detecting, repeating, and deriving are performed during each initializing operation of the electric instrument to update the mechanical constants.

18. The method according to claim 12, wherein the body includes a movable element, and the steps of applying, detecting, repeating, and deriving are performed with respect to each of a plurality of positions of the movable element relative to the body, and wherein the step of exerting includes the step of, when the movable element is positioned at one of the plurality of positions, exerting the controlling forces in response to the monitored vibration of the body in accordance with the derived mechanical constants of the body corresponding to the one of the plurality of positions of the movable element.

19. The method according to claim 12, wherein the body includes a movable element having predetermined mechanical constants, and the steps of applying, detecting, repeating, and deriving are performed with the movable element positioned at specific one of a plurality of possible positions relative to the body, wherein the method further comprises the step of calculating the mechanical constants of the body for each of the plurality of possible positions of the movable elements from the predetermined mechanical constants of the movable element and the mechanical constants of the body derived for the specific one of the plurality of possible positions of the movable element, and wherein the step of exerting includes, when the movable element is positioned at one of the plurality of possible positions, exerting the controlling forces in response to the monitored vibration of the body in accordance with the calculated mechanical constants of the body corresponding to the one of the plurality of possible positions of the movable element.

20. A method for suppressing vibration of an exposure apparatus having at least six degrees of freedom, the exposure apparatus being supported by a plurality of anti-vibration mounts each having a predetermined damping coefficient and a predetermined spring constant, the method comprising the steps of:

applying a plurality of forces at a plurality of points of the exposure apparatus, the plurality of forces applied at the plurality of points generating motions of the exposure apparatus including at least three translational modes and three rotational modes sufficient for determining mechanical constants of the exposure apparatus with predetermined accuracy;

measuring the motions of the exposure apparatus generated in response to the plurality of forces;

deriving the mechanical constants of the exposure apparatus from the measured motions of the exposure apparatus generated in response to the plurality of forces;

monitoring the vibration of the exposure apparatus; and exerting controlling forces at a plurality of points of the exposure apparatus in response to the monitored vibration of the exposure apparatus in accordance with the derived mechanical constants of the exposure apparatus to suppress the vibration of the exposure apparatus, the plurality of points at which the controlling forces are exerted being so arranged as to eliminate the vibration of the exposure apparatus having at least six degrees of freedom.

21. The method according to claim 20, wherein the exposure apparatus includes a plurality of parts assembled, and the steps of applying, measuring, and deriving are performed immediately after assembly of the plurality of parts.

22. The method according to claim 20, wherein the exposure apparatus includes an electric instrument, and the steps of applying, measuring, and deriving are performed during an initializing operation of the electric instrument to update the mechanical constants.

23. The method according to claim 20, wherein the step of deriving includes deriving the mechanical constants of the exposure apparatus from the damping coefficients and the spring constants of the anti-vibration mounts and the measured motions of the exposure apparatus generated in response to the predetermined forces.

24. The method according to claim 20, wherein the step of exerting includes the step of engaging a plurality of actuators to the exposure apparatus to exert the respective controlling forces to the exposure apparatus in response to the monitored vibration of the exposure apparatus in accordance with the derived mechanical constants of the exposure apparatus to suppress the vibration of the exposure apparatus.

25. The method according to claim 24, wherein the step of exerting further includes the step of determining a parameter for operating each of the actuators in accordance with the derived mechanical constants of the exposure apparatus.

26. The method according to claim 25, wherein each of the parameters includes a gain of the corresponding actuator.

27. The method according to claim 20, wherein the exposure apparatus includes a movable element, and the steps of applying, measuring, and deriving are performed with respect to each of a plurality of positions of the movable element relative to the exposure apparatus, and wherein the step of exerting includes the step of, when the movable element is positioned at one of the plurality of positions, exerting the controlling forces in response to the monitored vibration of the exposure apparatus in accordance with the derived mechanical constants of the exposure apparatus corresponding to the one of the plurality of positions of the movable element.

28. The method according to claim 20, wherein the exposure apparatus includes a movable element having predetermined mechanical constants, and the steps of applying, measuring, and deriving are performed with the movable element positioned at specific one of a plurality of possible positions relative to the exposure apparatus, wherein the method further comprises the step of calculating the mechanical constants of the exposure apparatus for each of the plurality of possible positions of the movable elements from the predetermined mechanical constants of the movable element and the mechanical constants of the exposure apparatus derived for the specific one of the plurality of possible positions of the movable element, and wherein the step of exerting includes, when the movable element is positioned at one of the plurality of possible positions, exerting the controlling forces in response to the monitored vibration of the exposure apparatus in accordance with the calculated mechanical constants of the exposure apparatus corresponding to the one of the plurality of possible positions of the movable element.

* * * * *